United States Patent
Lee et al.

(10) Patent No.: US 11,716,884 B2
(45) Date of Patent: Aug. 1, 2023

(54) LIGHT-EMITTING DISPLAY APPARATUS

(71) Applicant: Samsung Display Co., Ltd., Yongin-si (KR)

(72) Inventors: Ahram Lee, Yongin-si (KR); Seongsik Ahn, Yongin-si (KR); Minki Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 62 days.

(21) Appl. No.: 17/329,055

(22) Filed: May 24, 2021

(65) Prior Publication Data

US 2021/0280665 A1    Sep. 9, 2021

Related U.S. Application Data

(62) Division of application No. 16/398,631, filed on Apr. 30, 2019, now Pat. No. 11,043,548.

(30) Foreign Application Priority Data

May 2, 2018   (KR) .................... 10-2018-0050680

(51) Int. Cl.
*H10K 59/131* (2023.01)
*H10K 77/10* (2023.01)
*H10K 102/00* (2023.01)

(52) U.S. Cl.
CPC ......... *H10K 59/131* (2023.02); *H10K 77/111* (2023.02); *H10K 2102/311* (2023.02)

(58) Field of Classification Search
None
See application file for complete search history.

(56) References Cited

U.S. PATENT DOCUMENTS

| 9,600,112 B2 | 3/2017 | Zhang et al. |
| 9,812,659 B2 | 11/2017 | Kwon et al. |
| 10,056,446 B2 | 8/2018 | Kim et al. |

(Continued)

FOREIGN PATENT DOCUMENTS

| JP | 2018-025756 | 2/2018 |
| KR | 10-0671660 | 1/2007 |

(Continued)

OTHER PUBLICATIONS

Non-Final Office Action dated Jul. 23, 2020, in U.S. Appl. No. 16/398,631.

(Continued)

*Primary Examiner* — Jay C Chang
(74) *Attorney, Agent, or Firm* — H.C. Park & Associates, PLC

(57) ABSTRACT

A display apparatus includes a substrate including a bending area between a first area and a second area, and bent along a bending axis; a display unit provided over the first area of the substrate; and a wiring unit provided over the bending area and including a wiring crossing the bending axis, wherein the wiring includes a first central wiring having a straight line shape, a second central wiring parallel-positioned at one side of the first central wiring by having a certain distance from the first central wiring, and a first bridge wiring obliquely connecting the first central wiring with the second central wiring.

7 Claims, 8 Drawing Sheets

(56) References Cited

U.S. PATENT DOCUMENTS

| | | | | |
|---|---|---|---|---|
| 2017/0092884 A1* | 3/2017 | Zhang | ................... | G06F 3/0412 |
| 2017/0288009 A1 | 10/2017 | Kim et al. | | |
| 2017/0371190 A1 | 12/2017 | Yamazaki et al. | | |
| 2018/0175131 A1 | 6/2018 | Lee | | |
| 2018/0366534 A1* | 12/2018 | Tomioka | ............. | H01L 51/0097 |

FOREIGN PATENT DOCUMENTS

| | | |
|---|---|---|
| KR | 20170054436 A | 5/2017 |
| KR | 20170063606 A | 6/2017 |
| KR | 10-2017-0103048 | 9/2017 |
| KR | 10-2017-0114040 | 10/2017 |

OTHER PUBLICATIONS

Final Office Action dated Dec. 14, 2020, in U.S. Appl. No. 16/398,631.
Notice of Allowance dated Feb. 24, 2021, in U.S. Appl. No. 16/398,631.
Trapezoids, sites.math.washington.edu/~king/coursedir/m444a00/syl/class/trapezoids/Trapezoids.html. (Year: 2020).

* cited by examiner

LIGHT-EMITTING DISPLAY APPARATUS

CROSS-REFERENCE TO RELATED APPLICATION

This application is a Divisional of U.S. patent application Ser. No. 16/398,631, filed on Apr. 30, 2019, and claims priority from and the benefit of Korean Patent Application No. 10-2018-0050680, filed on May 2, 2018, each of which is hereby incorporated by reference for all purposes as if fully set forth herein.

BACKGROUND

Field

Exemplary embodiments of the invention relate generally to a display apparatus, and more specifically, to a display apparatus with an increased service life and in which the occurrence of defects such as disconnection in a manufacturing procedure may be minimized.

Discussion of the Background

In general, a display apparatus has a display unit over a substrate. By bending at least a part of the display apparatus, visibility at various angles may be improved, or an area of a display region may be decreased.

However, when a bent display apparatus according to the related art is manufactured, a defect may occur or a service life of the display apparatus may be reduced.

The above information disclosed in this Background section is only for understanding of the background of the inventive concepts, and, therefore, it may contain information that does not constitute prior art.

SUMMARY

Devices constructed according to exemplary embodiments of the invention solve various problems, including the aforementioned problem. Exemplary embodiments provide a display apparatus with an increased service life and in which the occurrence of a defect such as disconnection in a manufacturing procedure may be minimized.

However, it should be understood that embodiments described herein should be considered in a descriptive sense only and not for limitation of the disclosure. Additional features of the inventive concepts will be set forth in the description which follows, and in part will be apparent from the description, or may be learned by practice of the inventive concepts.

In accordance with an exemplary embodiment, a display apparatus includes a substrate including a bending area between a first area and a second area, and bent along a bending axis; a display unit provided over the first area of the substrate; and a wiring unit provided over the bending area and including a plurality of wirings crossing the bending axis, wherein each of the plurality of wirings includes a central wiring having a straight shape, at least one first auxiliary wiring extending in one direction with respect to the central wiring, and at least one second auxiliary wiring extending in another direction with respect to the central wiring, wherein the at least one first auxiliary wiring and the at least one second auxiliary wiring are alternately provided by partially overlapping each other.

Each of the plurality of wirings may include a first junction where one end of the at least one first auxiliary wiring contacts the central wiring, a second junction where the other end of the at least one first auxiliary wiring contacts the central wiring, a third junction where one end of the at least one second auxiliary wiring contacts the central wiring, and a fourth junction where the other end of the at least one second auxiliary wiring contacts the central wiring, wherein the fourth junction is provided between the first junction and the second junction.

Each of the plurality of wirings further may include at least one third auxiliary wiring extending in the other direction with respect to the central wiring and provided most adjacent to the at least one second auxiliary wiring, a fifth junction where one end of the at least one third auxiliary wiring contacts the central wiring, and a sixth junction where the other end of the at least one third auxiliary wiring contacts the central wiring, wherein the fifth junction is provided between the first junction and the second junction.

The fourth junction and the fifth junction may be spaced apart from each other by a certain interval.

On a plane, a shape formed by at least the portion of the central wiring and each of the at least one first auxiliary wiring and the at least one second auxiliary wiring may include a trapezoid.

The at least one first auxiliary wiring may include a first straight line spaced apart from the central wiring by a certain distance, a first connection part connecting one end of the first straight line with the central wiring, and a second connection part connecting the other end of the first straight line with the central wiring.

The first straight line and the central wiring may be parallel to each other.

Each of the first connection part and the second connection part may be obliquely arranged to have an obtuse angle with the first straight line and have an acute angle with the central wiring, the acute angle ranging from about 30 degrees to about 60 degrees.

The at least one second auxiliary wiring may include a second straight line spaced apart from the central wiring by a certain distance, a third connection part connecting one end of the second straight line with the central wiring, and a fourth connection part connecting the other end of the second straight line with the central wiring, wherein the second straight line and the central wiring are parallel to each other.

The first connection part and the fourth connection part may be parallel to each other, and the second connection part and the third connection part may be parallel to each other.

The central wiring may be provided orthogonal to the bending axis.

The wiring unit may be a data wiring unit configured to transmit a data signal to the display unit.

In accordance with another exemplary embodiment, a display apparatus includes a substrate including a bending area between a first area and a second area, and bent along a bending axis; a display unit provided over the first area of the substrate; and a wiring unit provided over the bending area and including a wiring crossing the bending axis, wherein the wiring includes a first central wiring having a straight line shape, a second central wiring parallel-positioned at one side of the first central wiring by having a certain distance from the first central wiring, and a first bridge wiring obliquely connecting the first central wiring with the second central wiring.

The wiring may further include a second bridge wiring that is spaced apart from the first bridge wiring by a certain distance and obliquely connects the first central wiring with the second central wiring, wherein the first bridge wiring and the second bridge wiring are parallel to each other.

The wiring may further include a third central wiring having a straight line shape and parallel-positioned at the other side of the first central wiring by having a certain distance from the first central wiring, and a third bridge wiring obliquely connecting the first central wiring with the third central wiring, wherein the third bridge wiring is provided between the first bridge wiring and the second bridge wiring.

The display apparatus may further include a second bridge wiring that is spaced apart from the first bridge wiring by a certain distance and obliquely connects the first central wiring with the second central wiring, wherein the first bridge wiring and the second bridge wiring cross each other.

The wiring may further include a third central wiring having a straight line shape and parallel-positioned at the other side of the first central wiring by having a certain distance from the first central wiring, and a third bridge wiring obliquely connecting the first central wiring with the third central wiring, wherein the third bridge wiring is provided between the first bridge wiring and the second bridge wiring.

The wiring may further include a fourth bridge wiring that obliquely connects the first central wiring with the third central wiring and is spaced apart from the third bridge wiring by a certain distance, wherein the first bridge wiring is provided between the third bridge wiring and the fourth bridge wiring.

The first central wiring and the second central wiring may be provided orthogonal to the bending axis.

The wiring unit may be a data wiring unit configured to transmit a data signal to the display unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
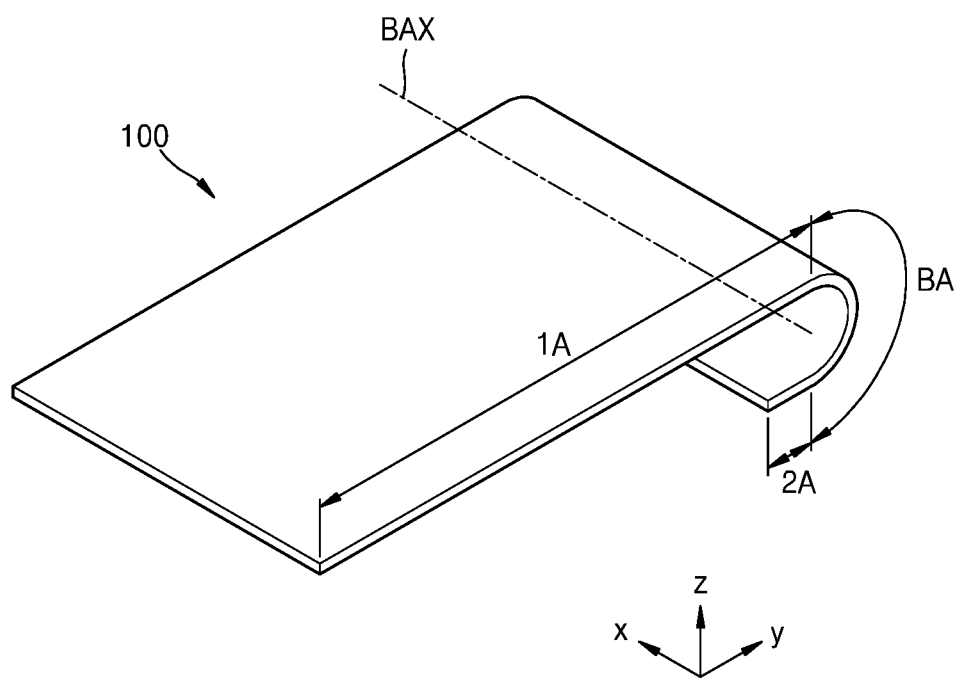
FIG. 1 is a perspective view illustrating a portion of a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, such as the x, y, and z-axes, and may be interpreted in a broader sense. For example, the x-axis, the y-axis, and the z-axis may be perpendicular to one another, or may represent different directions that are not necessarily perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In another embodiment, an order of processes may be different from that is described. For example, two processes that are sequentially described may be substantially simultaneously performed, or may be performed in an opposite order to the described order.

A display apparatus according to one or more embodiments is configured to display an image, and may include a liquid crystal display, an electrophoretic display, an organic light-emitting display, an inorganic light-emitting display, a field emission display, a surface-conduction electron-emitter display, a plasma display, a cathode ray display, or the like.

Though an organic light-emitting display apparatus is described as a display apparatus according to an embodiment, the display apparatus is not limited thereto and various types of display apparatuses may be used.

Figure 2:
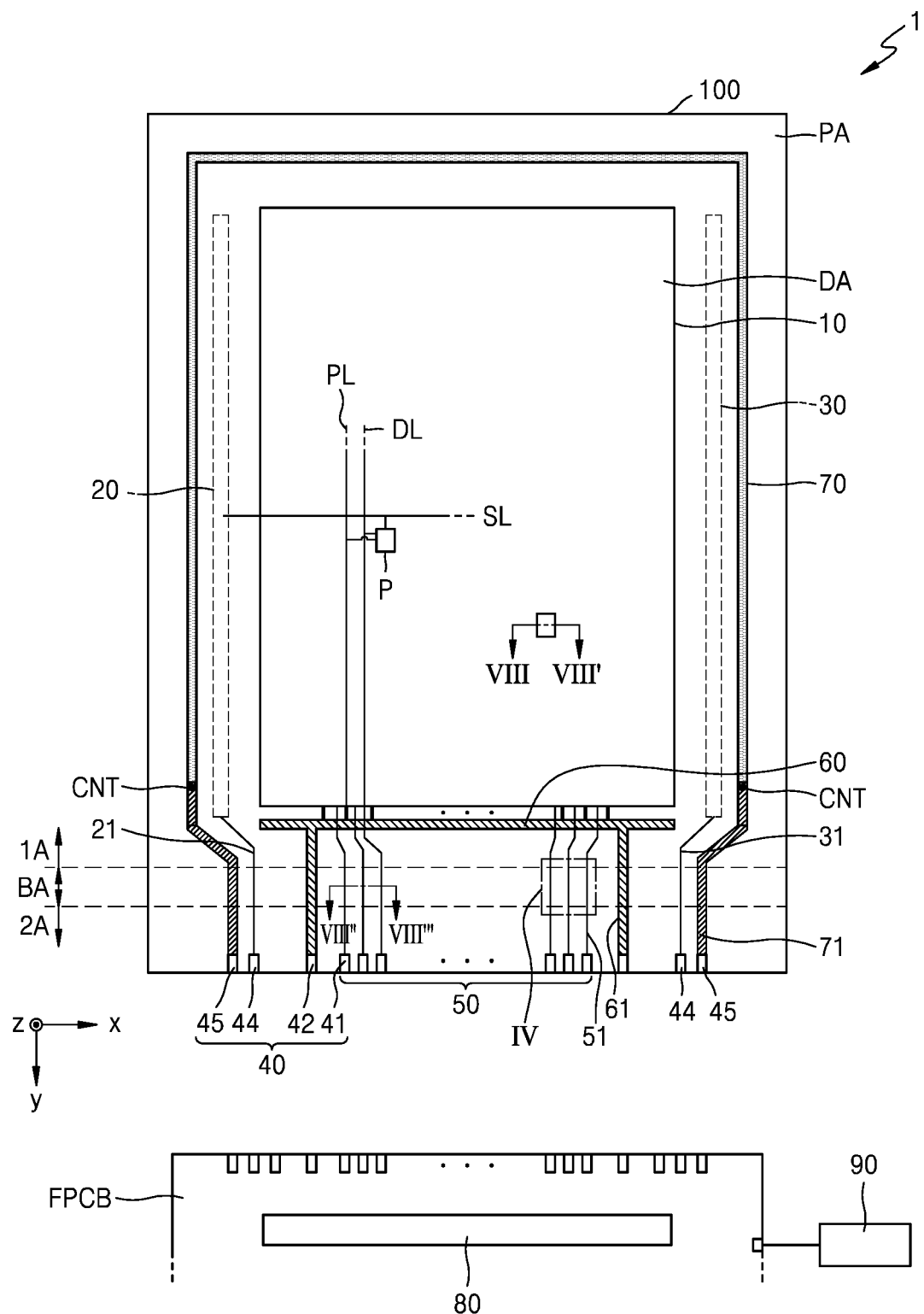
FIG. 2 is a plan view illustrating a structure of the display apparatus of FIG. 1, which is not bent.

FIG. 1 is a perspective view illustrating a portion of a display apparatus according to an embodiment, and FIG. 2 is a plan view illustrating a structure of the display apparatus of FIG. 1, in a state in which is not bent.

Referring to FIGS. 1 and 2, a substrate 100 included in the display apparatus according to the present embodiment has a bending area BA between a first area 1A and a second area 2A. The bending area BA is provided between the first area 1A and the second area 2A in another direction (a +y direction) that crosses a direction (a +x direction). As illustrated in FIG. 1, the substrate 100 is bent with respect to a bending axis BAX extending in the direction (the +x direction).

The substrate 100 may include various materials and may be flexible or bendable. For example, the substrate 100 may include polymer resins such as polyether sulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

A display area DA is included in the first area 1A. That is, as illustrated in FIG. 2, the first area 1A includes the display area DA and a portion of a peripheral area PA outside the display area DA. The peripheral area PA includes the bending area BA and the second area 2A.

Referring to FIG. 2, a display apparatus 1 includes a display unit 10 over the substrate 100. The display unit 10 includes pixels P that are connected to a scan line SL extending in a y-direction and a data line DL and a drive voltage line PL extending in an x-direction that crosses the y-direction. The display unit 10 provides an image via light emitted from the pixels P, and defines the display area DA.

Each of the pixels P may emit red light, green light, blue light, or white light. Each pixel P may include a display device, and the display device may include an organic light-emitting diode. In the present specification, a pixel P indicates a pixel that emits one of red light, green light, blue light, and white light, as described above. A structure of the pixel P will be described in detail with reference to FIG. 3.

The peripheral area PA is arranged outside the display area DA. For example, the peripheral area PA may surround the display area DA. The peripheral area PA is an area in which the pixels P are not arranged, and corresponds to a non-display area that does not provide an image. In the present embodiment, the bending area BA may be defined as a part of the display area DA, and thus, the bending area BA may be a non-display area that does not provide an image.

A drive circuit, e.g., first and second drive circuits 20 and 30, a pad unit 40, a drive power supply wiring 60, and a common power supply wiring 70 may be arranged on the peripheral area PA.

The first and second drive circuits 20 and 30 are arranged on the peripheral area PA of the substrate 100, and generate and transmit a scan signal to each pixel P via the scan line SL. For example, the first drive circuit 20 may be positioned on the left of the display unit 10, and the second drive circuit 30 may be positioned on the right of the display unit 10, but the present disclosure is not limited thereto. In another embodiment, only one scan drive circuit may be arranged.

The pad unit 40 is arranged at an end of the substrate 100, and includes a plurality of pads 41, 42, 44, and 45. The pad unit 40 may be exposed by not being covered by an insulating layer and may be electrically connected to a flexible printed circuit board FPCB. The pad unit 40 may be arranged at a side of the substrate 100, and the first and second drive circuits 20 and 30 may not be arranged at the side.

The flexible printed circuit board FPCB electrically connects a controller 90 to the pad unit 40, and a signal or power from the controller 90 is delivered via connection wirings 21, 31, 51, 61, and 71 that are connected to the pad unit 40.

The controller 90 receives a vertical synchronization signal, a horizontal synchronization signal, and a clock signal and then generates a control signal to control driving of the first and second drive circuits 20 and 30, the generated control signal may be transmitted to each of the first and second drive circuits 20 and 30 via the connection wirings 21 and 31 and the pad 44 that are connected to the flexible printed circuit board FPCB, scan signals from the first and second drive circuits 20 and 30 may be provided to each pixel P via the scan line SL. Then, the controller 90 provides drive power ELVDD and common power ELVSS to each of the drive power supply wiring 60 and the common power supply wiring 70 via the connection wirings 61 and 71 and the pads 42 and 45 that are connected to the flexible printed circuit board FPCB. The drive power ELVDD may be provided to each pixel P via a drive voltage line PL, and the common power ELVSS may be provided to a common electrode of each pixel P.

A data drive circuit 80 may be arranged on the flexible printed circuit board FPCB. The data drive circuit 80 provides a data signal to each pixel P. The data signal of the data drive circuit 80 is provided to each pixel P via the connection wiring 51 (hereinafter, also referred to as the wiring 51) connected to the pad 41 and the data line DL connected to the wiring 51. FIG. 2 illustrates the embodiment in which the data drive circuit 80 is arranged on the flexible printed circuit board FPCB, but the present disclosure is not limited thereto. In another embodiment, the data drive circuit 80 may be arranged on the peripheral area PA of the substrate 100.

The drive power supply wiring 60 may be arranged on the peripheral area PA. For example, the drive power supply wiring 60 may be provided between the pad unit 40 and a side of the display unit 10, the side being adjacent to the pad unit 40. The drive power ELVDD that is provided via the connection wiring 61 connected to the pad 42 may be supplied to each pixel P via the drive voltage line PL.

The common power supply wiring 70 is arranged on the peripheral area PA, and may partially surround the display unit 10. For example, the common power supply wiring 70 has a loop shape that is open to the side of the display unit 10, the side being adjacent to the pad unit 40. The common power supply wiring 70 may extend along edges of the substrate 100, except for the pad unit 40.

The common power supply wiring 70 of FIG. 2 is electrically connected to the connection wiring 71 connected to the pad 45, and provides the common power ELVSS to an opposite electrode 330 (e.g., a cathode, see FIG. 8) of the organic light-emitting diode of each pixel P. FIG. 2 illustrates the embodiment in which the common power supply wiring 70 has the loop shape having an open side, partially surrounds the display unit 10, and partially overlaps the connection wiring 71. The connection wiring 71 and the common power supply wiring 70 may be connected via an insulating layer arranged therebetween, e.g., via a contact hole CNT of an inorganic insulating layer, and a connection area between the connection wiring 71 and the common power supply wiring 70, i.e., the contact hole CNT, may be adjacent to the side of the display unit 10 toward the pad unit 40. In another embodiment, the common power supply wiring 70 may be directly connected to the pad 45, without separately having the connection wiring 71.

Although not illustrated, a thin-film encapsulation unit (not shown) configured to encapsulate the display unit 10 from the outside may be further arranged on the display unit 10. The thin-film encapsulation unit (not shown) may be a multilayer in which an inorganic layer and an organic layer are alternately stacked. The thin-film encapsulation unit (not shown) may cover the display unit 10 and circuit units (e.g., the first and second drive circuits 20 and 30, and the common power supply wiring 70) on the peripheral area PA, and may extend to the edges of the substrate 100.

Figure 3:
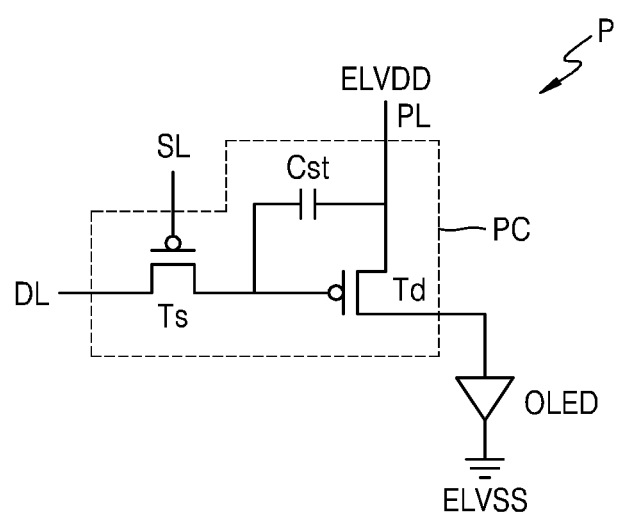
FIG. 3 is an equivalent circuit diagram of one of pixels of the display apparatus of FIG. 1.

FIG. 3 is an equivalent circuit diagram of one of the pixels of the display apparatus 1 of FIG. 1.

Referring to FIG. 3, a pixel P may include a pixel circuit PC connected to a scan line SL and a data line DL, and an organic light-emitting diode OLED connected to the pixel circuit PC. The pixel circuit PC includes a driving thin-film transistor Td, a switching thin-film transistor Ts, and a storage capacitor Cst. The switching thin-film transistor Ts is connected to the scan line SL and the data line DL, and transmits a data signal to the driving thin-film transistor Td, the data signal being input via the data line DL in response to a scan signal that is input via the scan line SL.

The storage capacitor Cst is connected to the switching thin-film transistor Ts and a drive voltage line PL and storages voltage corresponding to a difference between voltage received from the switching thin-film transistor Ts and drive power ELVDD supplied to the drive voltage line PL.

The driving thin-film transistor Td is connected to the drive voltage line PL and the storage capacitor Cst, and may control driving current flowing from the drive voltage line PL to the organic light-emitting diode OLED, in response to the voltage stored in the storage capacitor Cst. The organic light-emitting diode OLED may emit light having predetermined luminance, due to the driving current. For example, the organic light-emitting diode OLED may emit red light, green light, blue light, or white light.

FIG. 3 illustrates the embodiment in which the pixel P includes two thin-film transistors and one storage thin-film transistor, but the present disclosure is not limited thereto. In another embodiment, the pixel circuit PC of the pixel P may be variously modified to include at least three thin-film transistors or at least two storage thin-film transistors.

Referring back to FIG. 2, the bending area BA may be positioned in an area of the peripheral area PA in which the connection wirings 21, 31, 51, 61, and 71 are fanned out, thus, the connection wirings 21, 31, 51, 61, and 71 may be arranged on the bending area BA. The bending area BA is bent with respect to the bending axis BAX as illustrated in FIG. 1, and in a process where the bending area BA is bent with respect to the bending axis BAX, stress concentrates on the connection wirings 21, 31, 51, 61, and 71 on the bending area BA, and thus, there is a problem of a defect such as disconnection. In particular, the wiring 51 of a wiring unit 50, which is connected to the data line D and is from among the connection wirings 21, 31, 51, 61, and 71, includes a large number of lines that are sequentially arrayed at narrow intervals, and thus, the wiring 51 is susceptible to stress, compared to other lines.

To solve the problem, the display apparatus according to the present embodiment is resilient against stress by having the wiring unit 50 above the bending area BA, and has a structure capable of detouring a crack even if the crack occurs in a specific part of the wiring 51, such that it is possible to prevent complete disconnection of the wiring 51.

Figure 4:
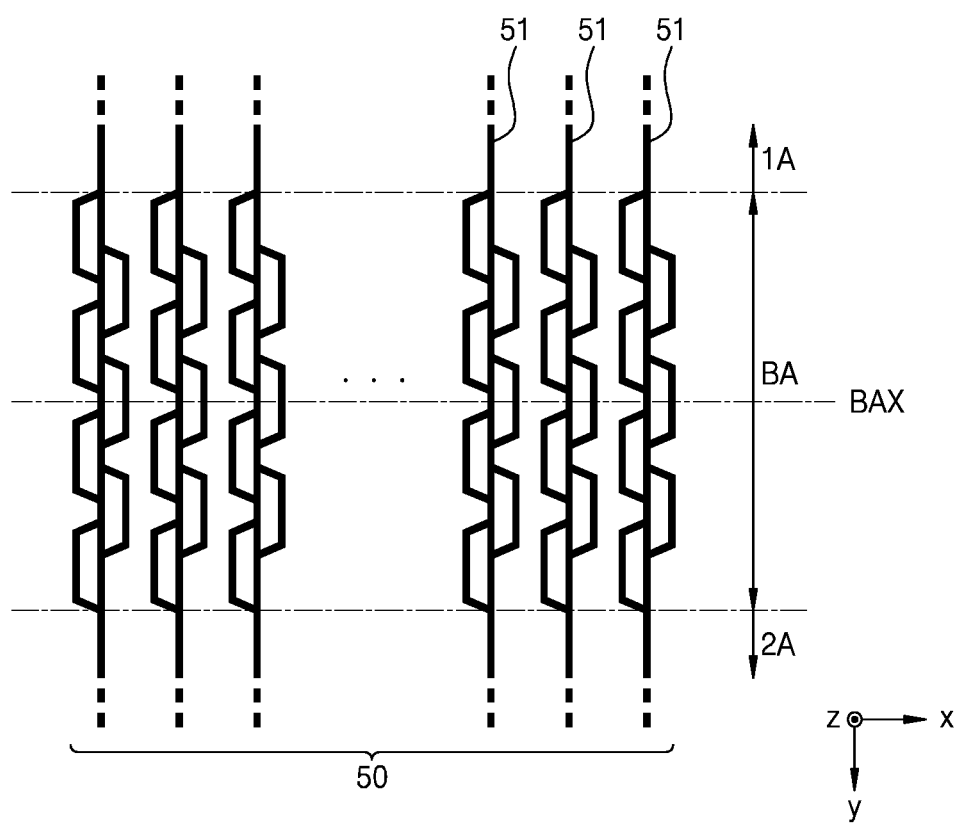
FIG. 4 is a plan view illustrating a magnified part IV of the display apparatus of FIG. 2.
Figure 5:
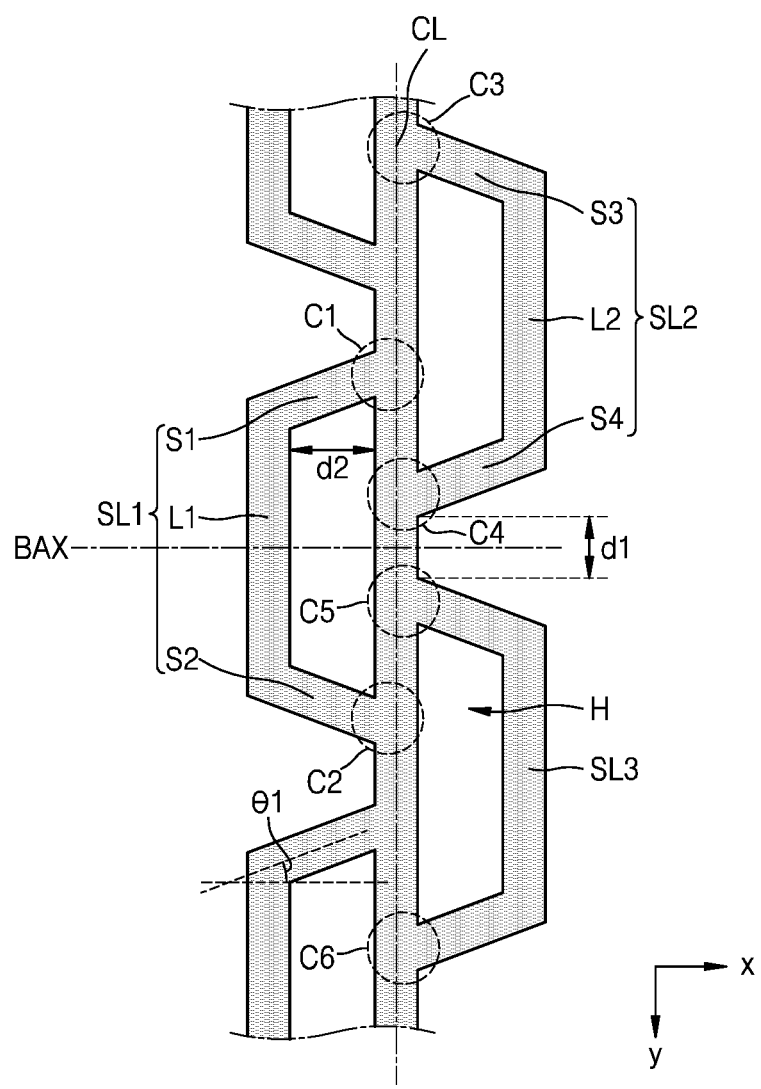
FIG. 5 is a plan view illustrating a structure of a wiring according to an exemplary embodiment.

FIG. 4 is a plan view illustrating a magnified part IV of the display apparatus 1 of FIG. 2, and FIG. 5 is a plan view illustrating a structure of a wiring according to an exemplary embodiment.

Referring to FIG. 4, the wiring unit 50 above the bending area BA may include a plurality of wirings 51. The wiring unit 50 may provide, to each pixel P, a data signal received from the data drive circuit 80 of FIG. 2.

The plurality of wirings 51 may be arranged on the bending area BA and may cross the bending axis BAX. In the present embodiment, the plurality of wirings 51 are orthogonal to the bending axis BAX, but the present disclosure is not limited thereto. As illustrated in FIG. 4, each of the plurality of wirings 51 may have a pattern that constantly repeats on a plane. Each of the plurality of wirings 51 may have the pattern on the bending area BA, and may have a straight line shape in the first area 1A and the second area 2A that are not bending areas. However, according to a design, some patterns of the plurality of wirings 51 on the bending area BA may be arranged on a contact area between the bending area BA and the first area 1A or may be arranged on a contact area between the bending area BA and the second area 2A.

Referring to FIG. 5, a structure of the wiring 51 from among the plurality of wirings 51 of the wiring unit 50 is illustrated. As illustrated in FIG. 4, because structures of the plurality of wirings 51 on the bending area BA are all equal, the structure of the wiring 51 will now be described.

The wiring 51 may include a central wiring CL having a straight shape, at least one first auxiliary wiring SL1 extending in one direction with respect to the central wiring CL, at least one second auxiliary wiring SL2 extending in another direction with respect to the central wiring CL, and a third auxiliary wiring SL3. The at least one first auxiliary wiring SL1 (hereinafter, the first auxiliary wiring SL1), the at least one second auxiliary wiring SL2 (hereinafter, the second auxiliary wiring SL2), and the third auxiliary wiring SL3 that are selectively positioned at either side of the central wiring CL may be portions of the wiring 51, the portions being distinguished depending on their shapes, and may be integrally formed.

The central wiring CL may have a straight shape extending along one axis on an entire region of the bending area BA. The straight shape does not correspond to a particular portion of the central wiring CL but, on the entire region of the bending area BA, the central wiring CL has the straight shape without having a bent portion. The central wiring CL may be understood as a main wiring configured to function as a center of the structure of the wiring 51.

In a comparative example, in a case where the central wiring CL has a bent portion or a curved inflection portion to reduce of stress applied to wirings of the bending area BA, stress is rather increased at the bent portion or the curved inflection portion such that a crack may occur. Accordingly, in the display apparatus according to the present embodiment, the central wiring CL has the straight shape such that stress that is applied to the wiring 51 is dispersed on the entire region of the bending area BA, and thus it is possible to prevent stress from being concentrated at a particular portion.

The first auxiliary wiring SL1, the second auxiliary wiring SL2, and the third auxiliary wiring SL3 may be selectively positioned at either side of the central wiring CL. The first auxiliary wiring SL1, the second auxiliary wiring SL2, and the third auxiliary wiring SL3 may be alternately arranged with respect to the central wiring CL. As illustrated in FIG. 4, even when the first auxiliary wiring SL1, the second auxiliary wiring SL2, and the third auxiliary wiring SL3 are alternately arranged with respect to the central wiring CL, the first auxiliary wiring SL1 and the second auxiliary wiring SL2 may partially overlap each other, and the first auxiliary wiring SL1 and the third auxiliary wiring SL3 may partially overlap each other. In this regard, the term 'overlap' may mean that, on a plane, the first auxiliary wiring SL1 and the second auxiliary wiring SL2 do not completely alternate with each other but may partially overlap each other in few regions.

The first auxiliary wiring SL1, the second auxiliary wiring SL2, and the third auxiliary wiring SL3 may be understood as detour wirings connected to the central wiring CL so as to prevent complete disconnection of the wiring 51 when a crack occurs at the central wiring CL.

The wiring 51 may include a first junction C1 where one end of the first auxiliary wiring SL1 contacts the central wiring CL, a second junction C2 where the other end of the first auxiliary wiring SL1 contacts the central wiring CL, a third junction C3 where one end of the second auxiliary wiring SL2 contacts the central wiring CL, and a fourth junction C4 where the other end of the second auxiliary wiring SL2 contacts the central wiring CL. In the present embodiment, the fourth junction C4 may be provided between the first junction C1 and the second junction C2. The fact that the fourth junction C4 is provided between the first junction C1 and the second junction C2 may mean that the first auxiliary wiring SL1 and the second auxiliary wiring SL2 may partially overlap each other as described above.

Equally, the wiring 51 may include a fifth junction C5 where one end of the third auxiliary wiring SL3 contacts the central wiring CL, and a sixth junction C6 where the other end of the third auxiliary wiring SL3 contacts the central wiring CL. In the present embodiment, the fifth junction C5 may be provided between the first junction C1 and the second junction C2. The fact that the fifth junction C5 is provided between the first junction C1 and the second junction C2 may mean that the first auxiliary wiring SL1 and the second auxiliary wiring SL2 may partially overlap each other as described above.

Referring to FIG. 5, both the fourth junction C4 and the fifth junction C5 may be provided between the first junction C1 and the second junction C2. In this regard, the fourth junction C4 and the fifth junction C5 may be spaced apart from each other by a distance d1. To position the fourth junction C4 and the fifth junction C5 by having a certain distance therebetween may mean that the second auxiliary wiring SL2 and the third auxiliary wiring SL3 that are most adjacent to each other are spaced apart from each other. In a comparative example, when the fourth junction C4 and the fifth junction C5 contact each other, stress is concentrated thereto, and thus, the fourth junction C4 and the fifth junction C5 may be spaced apart from each other to disperse stress.

As illustrated in FIG. 5, at least a portion of the central wiring CL and the first auxiliary wiring SL1, at least a portion of the central wiring CL and the second auxiliary wiring SL2, and at least a portion of the central wiring CL and the third auxiliary wiring SL3 may each form a closed polygon. In the present embodiment, on a plane, a shape formed by at least the portion of the central wiring CL and the first auxiliary wiring SL1 may be a trapezoid. This is the same in the second auxiliary wiring SL2 and the third auxiliary wiring SL3. In this manner, shapes formed by the first auxiliary wiring SL1, the second auxiliary wiring SL2, and the third auxiliary wiring SL3 may be different from each other only in locations and may be equal to each other.

Describing with reference to the first auxiliary wiring SL1, the first auxiliary wiring SL1 may include a first straight line L1 spaced apart from the central wiring CL by a distance d2, a first connection part S1 connecting one end of the first straight line L1 with the central wiring CL, and a second connection part S2 connecting the other end of the first straight line L1 with the central wiring C. The first straight line L1 may be parallel to the central wiring CL, and the first connection part S1 and the second connection part S2 may be arranged while having an angle with the first straight line L1.

Referring to FIG. 5, the first connection part S1 and the second connection part S2 may each be obliquely arranged to have an obtuse angle with the first straight line L1 and have an acute angle with the central wiring CL. With respect to obliqueness, in the present embodiment, the first connection part S1 or the second connection part S2 may be arranged to have an angle θ1 ranging from about 30 degrees to about 60 degrees with respect to a reference line (an X-axis). This may mean that an angle formed between the first connection part S1 or the second connection part S2 and the central wiring CL may range from about 30 degrees to about 60 degrees.

Similarly, the second auxiliary wiring SL2 may include a second straight line L2 spaced apart from the central wiring CL by the distance d2, a third connection part S3 connecting one end of the second straight line L2 with the central wiring CL, and a fourth connection part S4 connecting the other end of the second straight line L2 with the central wiring C. The second straight line L2 may be parallel to the central wiring CL, and the third connection part S3 and the fourth connection part S4 may be arranged while having an angle with the second straight line L2.

Referring to FIG. 5, the third connection part S3 and the fourth connection part S4 may each be obliquely arranged to have an obtuse angle with the second straight line L2 and have an acute angle with the central wiring CL. With respect to obliqueness, in the present embodiment, the third connection part S3 or the fourth connection part S4 may be arranged to have an angle ranging from about 30 degrees to about 60 degrees with respect to the reference line (the X-axis). This may mean that an angle formed between the third connection part S3 or the fourth connection part S4 and the central wiring CL may range from about 30 degrees to about 60 degrees. In the present embodiment, the first connection part S1 and the fourth connection part S4 may be parallel to each other, and the second connection part S2 and the third connection part S3 may be parallel to each other.

The third auxiliary wiring SL3 is equal to the second auxiliary wiring SL2, and thus, redundant descriptions thereof are not provided here.

In this manner, in the display apparatus according to the present embodiment, a shape of the wiring 51 of the wiring unit 50 above the bending area BA is formed as illustrated in FIG. 5, and thus, the display apparatus is strong against stress and has a structure capable of detouring a crack even if the crack occurs in a specific part of the wiring 51, such that it is possible to prevent complete disconnection of the wiring 51.

The central wiring CL of the wiring 51 has the straight shape such that stress that is applied to the wiring 51 is equally dispersed on the entire region of the bending area BA, and thus it is possible to prevent stress from being concentrated at a particular portion. Also, because the first auxiliary wiring SL1, the second auxiliary wiring SL2, and the third auxiliary wiring SL3 are alternately arranged at either side of the central wiring CL, when a crack occurs at the central wiring CL, a signal flows in the first auxiliary wiring SL1, the second auxiliary wiring SL2, and the third auxiliary wiring SL3, such that it is possible to prevent complete disconnection of the wiring 51.

Figure 6:
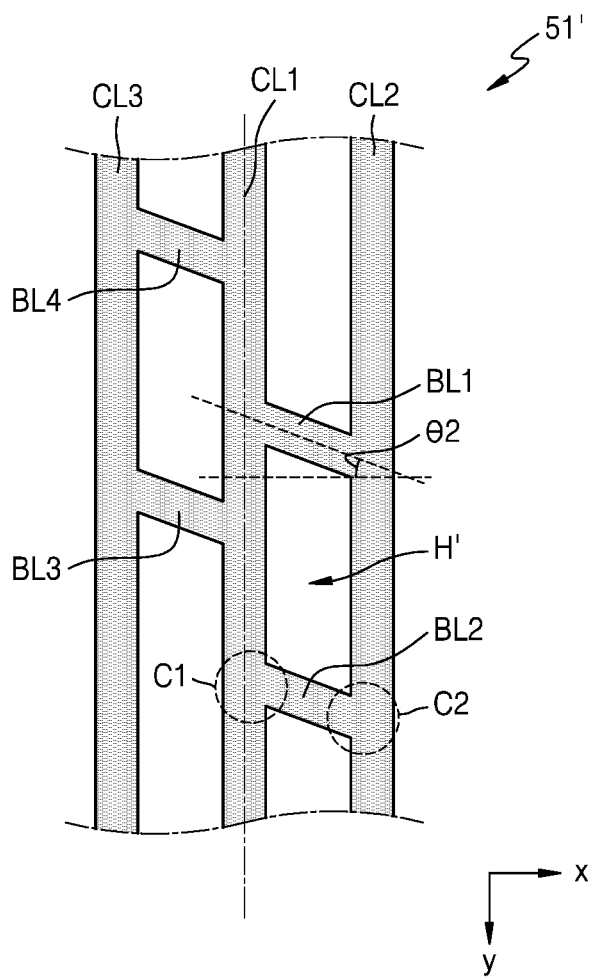
FIG. 6 is a plan view of a structure of a wiring according to another exemplary embodiment.

FIG. 6 is a plan view of a structure of a wiring 51' according to another exemplary embodiment.

Referring to FIG. 6, the wiring 51' may include a first central wiring CL1, a second central wiring CL2 positioned at one side of the first central wiring CL1 by having a certain distance therebetween, a third central wiring CL3 positioned at the other side of the first central wiring CL1 by having a certain distance therebetween, first and second bridge wirings BL1 and BL2 electrically connecting the first central wiring CL1 with the second central wiring CL2, and third and fourth bridge wirings BL3 and BL4 electrically connecting the first central wiring CL1 with the third central wiring CL3.

The first and second bridge wirings BL1 and BL2 connecting the first central wiring CL1 with the second central wiring CL2, and the third and fourth bridge wirings BL3 and BL4 connecting the first central wiring CL1 with the third central wiring CL3 are portions of the wiring 51' that are distinguished depending on shapes and may be integrally formed.

The first central wiring CL1, the second central wiring CL2, and the third central wiring CL3 may each have a straight shape extending along one axis on an entire region of the bending area BA. The straight shape does not correspond to particular portions of the first central wiring CL1, the second central wiring CL2, and the third central wiring CL3 but, on the entire region of the bending area BA, the first central wiring CL1, the second central wiring CL2, and the third central wiring CL3 each have the straight shape without having a bent portion. The first central wiring CL1 among them may be understood as a main wiring configured to function as a center of the structure of the wiring 51'.

The second central wiring CL2 may be positioned at one side of the first central wiring CL1, and the third central wiring CL3 may be positioned at the other side of the first central wiring CL1. The second central wiring CL2 and the third central wiring CL3 may each be spaced apart from the first central wiring CL1 by the same distance. The second central wiring CL2 and the third central wiring CL3 that are respectively positioned at both sides of the first central wiring CL1 are configured to disperse stress and provide a detour path for a case where a crack occurs at the first central wiring CL1.

The first and second bridge wirings BL1 and BL2 configured to electrically and structurally connect the first central wiring CL1 with the second central wiring CL2 may be provided between the first central wiring CL1 and the second central wiring CL2. As illustrated in FIG. 6, in the structure, the first and second bridge wirings BL1 and BL2 may obliquely connect the first central wiring CL1 with the second central wiring CL2. In the present embodiment, the first and second bridge wirings BL1 and BL2 may be parallel to each other.

The third and fourth bridge wirings BL3 and BL4 configured to electrically and structurally connect the first central wiring CL1 with the third central wiring CL3 may be provided between the first central wiring CL1 and the third central wiring CL3. As illustrated in FIG. 6, in the structure, the third and fourth bridge wirings BL3 and BL4 may obliquely connect the first central wiring CL1 with the third central wiring CL3. In the present embodiment, the third and fourth bridge wirings BL3 and BL4 may be parallel to each other.

In the present embodiment, the third bridge wiring BL3 may be provided between the first bridge wiring BL1 and the second bridge wiring BL2. In the structure of the wiring 51' of FIG. 6, the structure is repeatedly formed, and by doing so, all bridge wirings, i.e., the first, second, third, and fourth bridge wirings BL1, BL2, BL3, and BL4, are alternately positioned. By alternately positioning the bridge wirings BL1, BL2, BL3, and BL4, it is possible to prevent stress from being concentrated at a particular portion.

Referring to FIG. 6, the bridge wirings BL1, BL2, BL3, and BL4 may each be obliquely arranged with respect to central wirings, i.e., the first, second, and third central wirings CL1, CL2, and CL3. With respect to obliqueness, in the present embodiment, the bridge wirings BL1, BL2, BL3, and BL4 may each be arranged to have an angle θ2 ranging from about 30 degrees to about 60 degrees with respect to a reference line (an X-axis). This may mean that an angle formed between each of the bridge wirings BL1, BL2, BL3, and BL4 and each of the central wirings CL1, CL2, and CL3 may range from about 30 degrees to about 60 degrees.

In other words, referring to the second bridge wiring BL2 as an example, one end of the second bridge wiring BL2 makes a first junction C1 by contacting the first central wiring CL1, and the other end of the second bridge wiring BL2 makes a second junction C2 by contacting the second central wiring CL2. In the present embodiment, a straight line that virtually connects the first junction C1 to the second junction C2 may be oblique with respect to the reference line (the X-axis) by the angle θ2 ranging from about 30 degrees to about 60 degrees. In this manner, by obliquely positioning the bridge wirings BL1, BL2, BL3, and BL4 with the aforementioned angle, it is possible to prevent stress from being concentrated at a particular portion.

In the embodiment of FIG. 6, the bridge wirings BL1, BL2, BL3, and BL4 are obliquely provided in one direction, but in another embodiment, the first and second bridge wirings BL1 and BL2 may be provided in parallel, and the third and fourth bridge wirings BL3 and BL4 may be provided in parallel to each other in a direction crossing the first and second bridge wirings BL1 and BL2.

Figure 7:
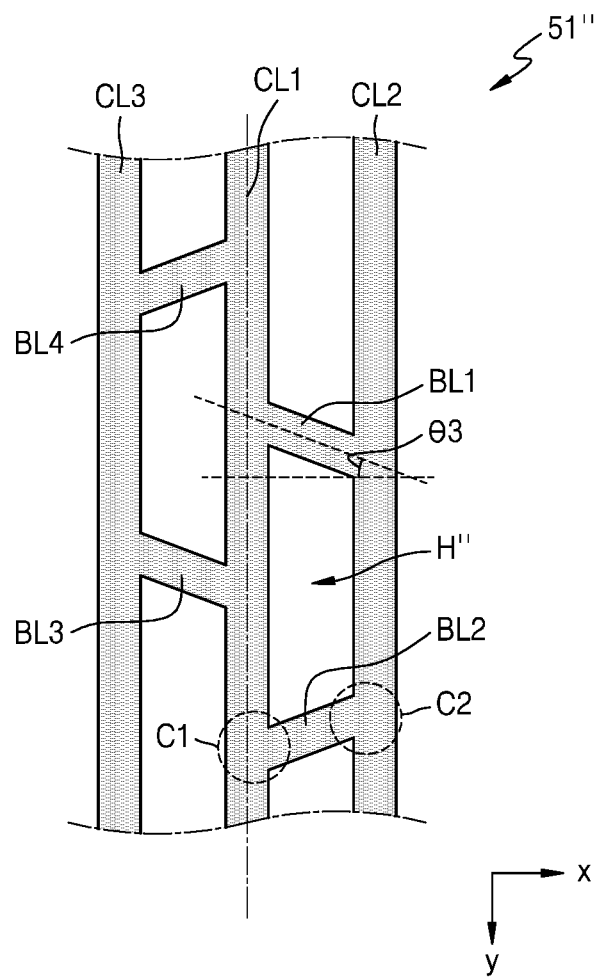
FIG. 7 is a plan view of a structure of a wiring according to another exemplary embodiment.

FIG. 7 is a plan view of a structure of a wiring 51" according to another exemplary embodiment.

Referring to FIG. 7, the wiring 51" may include a first central wiring CL1 having a straight shape, a second central wiring CL2 positioned at one side of the first central wiring CL1 by having a certain distance therebetween, a third central wiring CL3 positioned at the other side of the first central wiring CL1 by having a certain distance therebetween, first and second bridge wirings BL1 and BL2 electrically connecting the first central wiring CL1 with the second central wiring CL2, and third and fourth bridge wirings BL3 and BL4 electrically connecting the first central wiring CL1 with the third central wiring CL3.

Compared to the wiring 51' of FIG. 6, the wiring 51" of FIG. 7 is different in arrangement directions of bridge wirings, i.e., the first, second, third, and fourth bridge wirings BL1, BL2, BL3, and BL4.

The first and second bridge wirings BL1 and BL2 configured to electrically and structurally connect the first central wiring CL1 with the second central wiring CL2 may be provided between the first central wiring CL1 and the second central wiring CL2. As illustrated in FIG. 7, in the structure, the first and second bridge wirings BL1 and BL2 may obliquely connect the first central wiring CL1 with the second central wiring CL2. In the present embodiment, the first and second bridge wirings BL1 and BL2 may be provided in a direction crossing each other.

The third and fourth bridge wirings BL3 and BL4 configured to electrically and structurally connect the first central wiring CL1 with the third central wiring CL3 may be provided between the first central wiring CL1 and the third central wiring CL3. As illustrated in FIG. 7, in the structure, the third and fourth bridge wirings BL3 and BL4 may obliquely connect the first central wiring CL1 with the third central wiring CL3. In the present embodiment, the third and fourth bridge wirings BL3 and BL4 may be provided in a direction crossing each other.

In the present embodiment, the first bridge wiring BL1 and the third bridge wiring BL3 may be provided in parallel to each other, and the second bridge wiring BL2 and the fourth bridge wiring BL4 may be provided in parallel to each other.

The bridge wirings BL1, BL2, BL3, and BL4 may each be obliquely arranged with respect to central wirings, i.e., the first, second, and third central wirings CL1, CL2, and CL3. With respect to obliqueness, in the present embodiment, the bridge wirings BL1, BL2, BL3, and BL4 may each be arranged to have an angle θ3 ranging from about 30 degrees to about 60 degrees with respect to a reference line (an X-axis). This may mean that an angle formed between each of the bridge wirings BL1, BL2, BL3, and BL4 and each of the central wirings CL1, CL2, and CL3 may range from about 30 degrees to about 60 degrees.

In the present embodiment, the third bridge wiring BL3 may be provided between the first bridge wiring BL1 and the second bridge wiring BL2. In the structure of the wiring 51" of FIG. 7, the structure is repeatedly formed, and by doing so, all bridge wirings BL1, BL2, BL3, and BL4 are alternately positioned. By alternately positioning the bridge wirings BL1, BL2, BL3, and BL4, it is possible to prevent stress from being concentrated at a particular portion.

In other words, referring to the second bridge wiring BL2 as an example, one end of the second bridge wiring BL2 makes a first junction C1 by contacting the first central wiring CL1, and the other end of the second bridge wiring BL2 makes a second junction C2 by contacting the second central wiring CL2. In the present embodiment, a straight line that virtually connects the first junction C1 to the second junction C2 may be oblique with respect to the reference line (the X-axis) by the angle θ3 ranging from about 30 degrees to about 60 degrees. In this manner, by obliquely positioning the bridge wirings BL1, BL2, BL3, and BL4 with the aforementioned angle, it is possible to prevent stress from being concentrated at a particular portion.

Figure 8:
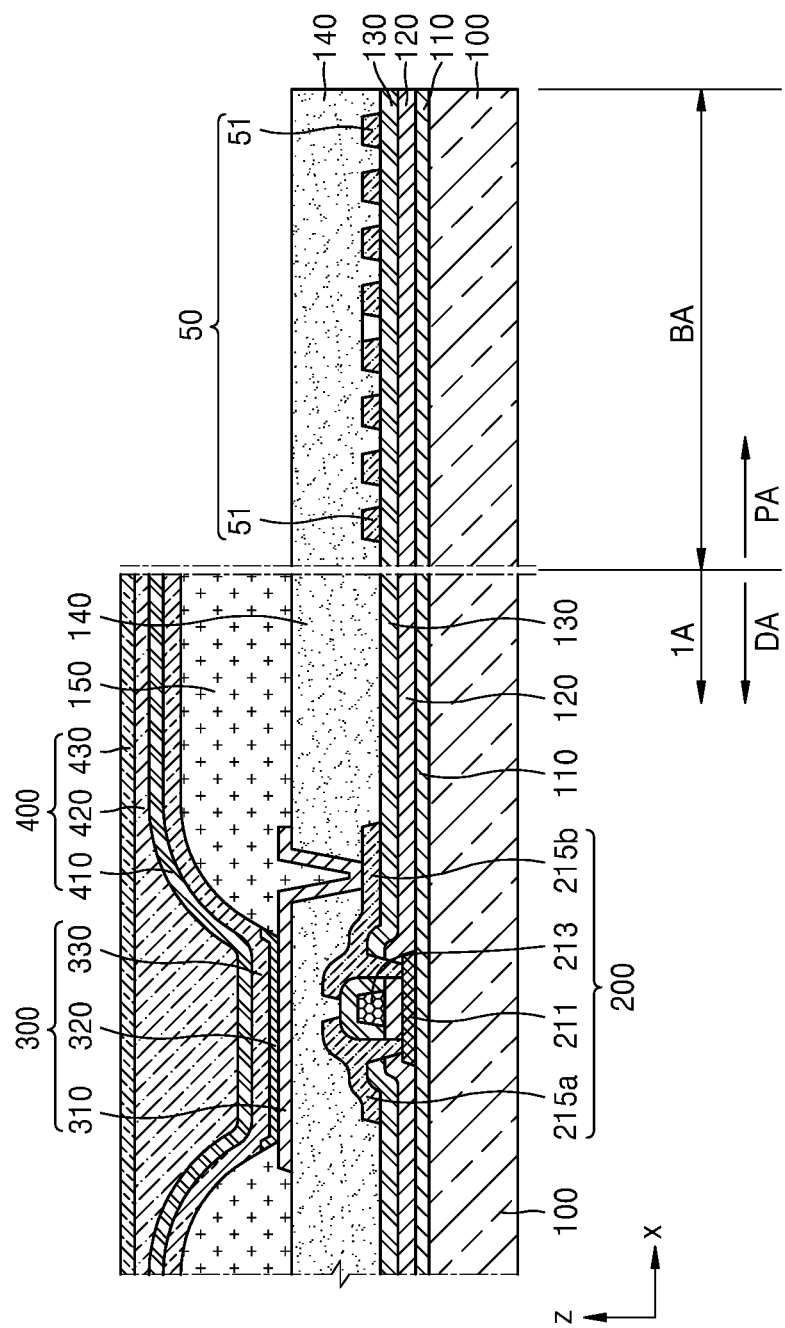
FIG. 8 is a plan view illustrating a cross-section of the display apparatus of FIGS. 1 and 2, taken along lines VIII-VIII' and VIII"-VIII'" of FIG. 2.

FIG. 8 is a plan view illustrating a cross-section of the display apparatus of FIGS. 1 and 2, taken along lines VIII-VIII' and VIII"-VIII'" of FIG. 2.

In FIG. 8, the cross-section by the line VIII-VIII' is taken from a pixel of the display area DA, and the cross-section by the line VIII"-VIII'" is taken from a portion of the wiring unit 50 above the bending area BA of the peripheral area PA.

First, referring to the display area DA, an organic light-emitting diode 300 and a thin-film transistor 200 to which the organic light-emitting diode 300 is electrically connected may be provided on the display area DA of the substrate 100. Although not illustrated, when required, the thin-film transistor 200 may be provided on the peripheral area PA outside the display area DA. A thin-film transistor (not shown) provided on the peripheral area PA may be a part of a drive circuit to control an electric signal applied into the display area DA.

A buffer layer 110 including inorganic materials such as silicon oxide, silicon nitride and/or silicon oxynitride may be provided above the substrate 100. The buffer layer 110 may be configured to improve planarization of a top surface of the substrate 100, or may prevent or minimize penetration of impurities from the substrate 100 into the thin-film transistor 200.

The thin-film transistor 200 may be provided above the buffer layer 110. The thin-film transistor 200 may include a semiconductor layer 211 including amorphous silicon, polysilicon, or an organic semiconductor material, a gate electrode 213, a source electrode 215a, and a drain electrode 215b.

To assure insulation between the semiconductor layer 211 and the gate electrode 213, a gate insulating layer 120 including inorganic materials such as silicon oxide, silicon nitride and/or silicon oxynitride may be provided between the semiconductor layer 211 and the gate electrode 213.

In addition, an interlayer insulating layer 130 including inorganic materials such as silicon oxide, silicon nitride and/or silicon oxynitride may be provided above the gate electrode 213, and the source electrode 215a and the drain electrode 215b may be provided above the interlayer insulating layer 130.

A planarization layer 140 may be provided above the thin-film transistor 200. For example, as illustrated in FIG. 8, when the organic light-emitting diode 300 is provided above the thin-film transistor 200, the planarization layer 140 may generally planarize a top surface of a protective layer covering the thin-film transistor 200. The planarization layer 140 may include an organic material such as acryl, benzocyclobutene (BCB), hexamethyldisiloxane (HMDSO), or the like.

The organic light-emitting diode 300 including a pixel electrode 310, an opposite electrode 330, and an intermediate layer 320 including an emission layer and provided between the pixel electrode 310 and the opposite electrode 330 may be provided above the planarization layer 140. As illustrated in FIG. 8, the pixel electrode 310 is electrically connected to the organic light-emitting diode 300 by contacting one of the source electrode 215a and the drain electrode 215b via a contact hole formed in the planarization layer 140.

A pixel-defining layer 150 may be provided above the planarization layer 140. The pixel-defining layer 150 has an opening corresponding to each sub-pixel, i.e., an opening exposing at least a center of the pixel electrode 310, thereby defining a pixel. Also, the pixel-defining layer 150 prevents occurrence of an arc at an edge of the pixel electrode 310, by increasing a distance between the edge of the pixel electrode 310 and the opposite electrode 330 above the pixel electrode 310. The pixel-defining layer 150 may include organic materials such as polyimide, HMDSO, or the like.

The intermediate layer 320 of the organic light-emitting diode 300 may include a small-molecule or polymer material. When the intermediate layer 320 includes a small-molecule material, the intermediate layer 320 may have a structure in which a hole injection layer (HIL), a hole transport layer (HTL), the emission layer, an electron transport layer (ETL), an electron injection layer (EIL), and the like are singularly or multiply stacked, and may include various organic materials including copper phthalocyanine (CuPc), N,N'-Di(naphthalene-1-yl)-N,N'-diphenyl-benzidine (NPB), tris-8-hydroxyquinoline aluminum)(Alq3), and the like. The layers may be formed using a vacuum deposition method.

When the intermediate layer 320 includes a polymer material, the intermediate layer 320 may have a structure including the HTL and the emission layer. In this regard, the HTL may include poly-(2,4)-ethylene-dihydroxy thiophene (PEDOT), and the emission layer may include poly-phenylene vinylene (PPV)-based polymer materials, polyfluorene-based polymer materials, and the like. The intermediate layer 320 may be formed by using a screen printing method, an inkjet printing method, a laser induced thermal imaging (LITI) method, or the like. The intermediate layer 320 may include one layer extending over a plurality of the pixel electrodes 310, or may include a layer that is patterned to correspond to each of the plurality of pixel electrodes 310.

The opposite electrode 330 may be above the display area DA, and may be provided above all regions of the display area DA. The opposite electrode 330 may be formed as one body extending above the display area DA and thus may correspond to the plurality of pixel electrodes 310.

The organic light-emitting diode 300 may be easily damaged by external moisture or oxygen, and thus, a thin-film encapsulating unit 400 is provided on the organic light-emitting diode 300 so as to protect the organic light-emitting diode 300. Although not illustrated, the thin-film encapsulating unit 400 may cover the display area DA and may extend to the peripheral area PA outside the display area DA.

The thin-film encapsulating unit 400 may include a first inorganic layer 410, an organic layer 420, and a second inorganic layer 430.

The first inorganic layer 410 may cover the opposite electrode 330 and may include silicon oxide, silicon nitride and/or silicon oxynitride. When required, other layers including a capping layer may be provided between the first inorganic layer 410 and the opposite electrode 330. Because the first inorganic layer 410 is arranged along a structure therebelow, a top surface of the first inorganic layer 410 is not planar.

The organic layer 420 covers the first inorganic layer 410, and unlike the first inorganic layer 410, the organic layer 420 may generally planarize its top surface. The organic layer 420 may include polyethylene terephthalate, polyethylene naphthalate, polycarbonate, polyimide, polyethylene sulfonate, polyoxymethylene, polyarylate, and/or hexamethyldisiloxane.

The second inorganic layer 430 may cover the organic layer 420 and may include silicon oxide, silicon nitride and/or silicon oxynitride. The second inorganic layer 430 may contact the first inorganic layer 410 at an edge of the display area DA, thereby preventing the organic layer 420 being externally exposed.

Referring to the peripheral area PA, the wiring unit 50 may be provided above the bending area BA. The wiring unit 50 may include a plurality of the wirings 51, and the plurality of wirings 51 may extend to the first area 1A and then may be electrically connected to pixels, respectively, and may extend to the second area 2A and then may be connected to the pad 41 (refer to FIG. 2).

In FIG. 8, the plurality of wirings 51 may include the same material as the source electrode 215a and the drain electrode 215b of the thin-film transistor 200. However, the present disclosure is not limited thereto, and the plurality of wirings 51 may include the same material as the gate electrode 213 of the thin-film transistor 200.

Some of the advantages that may be achieved by exemplary embodiments of the invention include a display apparatus that is resilient against stress by having the wiring above the bending area have a structure capable of detouring a crack even if the crack occurs in a specific part of the wiring, such that it is possible to prevent complete disconnection of the wiring.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus, comprising:
a substrate comprising a bending area between a first area and a second area, and bent along a bending axis;
a display unit provided over the first area of the substrate; and
a wiring unit provided over the bending area and comprising a wiring crossing the bending axis, wherein the wiring comprises a first central wiring having a straight line shape, a second central wiring parallel-positioned at one side of the first central wiring by having a certain distance from the first central wiring, and a first bridge wiring obliquely connecting the first central wiring with the second central wiring,
wherein the first central wiring and the second central wiring are provided orthogonal to the bending axis.

2. The display apparatus of claim 1, wherein the wiring further comprises a second bridge wiring that is spaced apart from the first bridge wiring by a certain distance and obliquely connects the first central wiring with the second central wiring,
wherein the first bridge wiring and the second bridge wiring are parallel to each other.

3. The display apparatus of claim 2, wherein the wiring further comprises a third central wiring having a straight line shape and parallel-positioned at an opposite side of the first central wiring by having a certain distance from the first central wiring, and a third bridge wiring obliquely connecting the first central wiring with the third central wiring,
wherein the third bridge wiring is provided between the first bridge wiring and the second bridge wiring.

4. The display apparatus of claim 1, further comprising a second bridge wiring that is spaced apart from the first bridge wiring by a certain distance and obliquely connects the first central wiring with the second central wiring,
wherein the first bridge wiring and the second bridge wiring cross each other.

5. The display apparatus of claim 4, wherein the wiring further comprises a third central wiring having a straight line shape and parallel-positioned at an opposite side of the first central wiring by having a certain distance from the first central wiring, and a third bridge wiring obliquely connecting the first central wiring with the third central wiring,
wherein the third bridge wiring is provided between the first bridge wiring and the second bridge wiring.

6. The display apparatus of claim 5, wherein the wiring further comprises a fourth bridge wiring that obliquely connects the first central wiring with the third central wiring and is spaced apart from the third bridge wiring by a certain distance,
wherein the first bridge wiring is provided between the third bridge wiring and the fourth bridge wiring.

7. The display apparatus of claim 1, wherein the wiring unit is a data wiring unit configured to transmit a data signal to the display unit.

* * * * *